(12) United States Patent
Oota

(10) Patent No.: US 8,467,193 B2
(45) Date of Patent: Jun. 18, 2013

(54) ELECTRONIC CONTROL UNIT

(75) Inventor: Shinsuke Oota, Kariya (JP)

(73) Assignee: Denso Corporation, Kariya (JP)

( * ) Notice: Subject to any disclaimer, the term of this patent is extended or adjusted under 35 U.S.C. 154(b) by 174 days.

(21) Appl. No.: 13/199,609

(22) Filed: Sep. 2, 2011

(65) Prior Publication Data

US 2012/0057318 A1  Mar. 8, 2012

(30) Foreign Application Priority Data

Sep. 6, 2010  (JP) ................. 2010-198871

(51) Int. Cl.
*H05K 5/00* (2006.01)
*H05K 7/04* (2006.01)

(52) U.S. Cl.
USPC .................. 361/753; 361/782; 361/783

(58) Field of Classification Search
USPC ................... 361/753, 782, 783
See application file for complete search history.

(56) References Cited

U.S. PATENT DOCUMENTS

| 2002/0029875 A1 | 3/2002 | Takano |
| 2002/0162678 A1 | 11/2002 | Takano |
| 2003/0002205 A1 | 1/2003 | Shibata et al. |

FOREIGN PATENT DOCUMENTS

| JP | 58-206199 | 12/1983 |
| JP | H4-8489 | 1/1992 |
| JP | 5-315782 | 11/1993 |
| JP | 10-084175 | 3/1998 |
| JP | 2000-091884 | 3/2000 |
| JP | 2000-279797 | 10/2000 |
| JP | 2002-94196 | 3/2002 |
| JP | 2003-016772 | 1/2003 |

OTHER PUBLICATIONS

Office Action dated Jul. 24, 2012 in corresponding Japanese Application No. 2010-198871 with English translation.

*Primary Examiner* — Ramon Barrera

(74) *Attorney, Agent, or Firm* — Harness, Dickey & Pierce, PLC

(57) ABSTRACT

A resin board is fixed to a plate member made of metal by a fixing member. A semi-conductor module and a capacitor are mounted on a first surface of the resin board. A first ground pattern is formed on the first surface and electrically connected to the plate member by means of the fixing member. A connector is also provided on the first surface such that the first ground pattern is interposed between the semi-conductor module and the connector. The heat from the semi-conductor module and the capacitor is transmitted to the plate member via the first ground pattern and the fixing member.

10 Claims, 13 Drawing Sheets

ELECTRONIC CONTROL UNIT

CROSS REFERENCE TO RELATED APPLICATION

This application is based on Japanese Patent Application No. 2010-198871 filed on Sep. 6, 2010, the disclosure of which is incorporated herein by reference.

FIELD OF THE INVENTION

The present invention relates to an electronic control unit, in particular, to an electronic control unit which can be applied to an electric power steering system.

BACKGROUND OF THE INVENTION

In recent years, many portions of a vehicle are operated by electric motors, and thereby numbers of the electric motors and electronic control units thereof are increased. Many efforts for increasing effective inside space of the vehicle have been made in order to provide a comfortable space to a user. Accordingly, it becomes a problem to keep space for the electric motors and the electronic control units thereof. It is, therefore, an important issue for making the electric motors and the electronic control units thereof smaller in size.

For example, an electronic control unit used for an electric power steering system for the vehicle is arranged in a space of an engine compartment or behind an instrument panel. Since the electronic control unit for the power steering system drives the electric motor with large electric current (around 100 A), heat generated at switching elements is increased. Therefore, a high heat radiating structure is necessary in order to make the electronic control unit of this kind smaller in size.

In prior arts, for example, as disclosed in the following Japanese patent publications, an electric connecting pattern for heat radiation is provided on a printed circuit board so as to radiate heat of electric and/or electronic parts mounted on the printed circuit board. According to the prior arts, although the electric connecting pattern for the heat radiation is provided or electric and/or electronic parts are effectively arranged on the printed circuit board, desired heat radiating performance can not be obtained.

EXAMPLES OF RELATED PRIOR ARTS

Japanese Patent Publication No. S58-206199
Japanese Utility Model Publication No. H04-8489
Japanese Patent Publication No. H05-315782
Japanese Patent Publication No. 2002-94196
Japanese Patent Publication No. 2003-16772

SUMMARY OF THE INVENTION

The present invention is made in view of the above problems. It is an object of the present invention to provide an electronic control unit, according to which heat generated by electric and/or electronic parts and/or components mounted on a printed circuit board is effectively radiated.

According to a feature of the invention, for example, as defined in the claim 1, an electronic control unit has a plate member, a resin board, a semi-conductor module, a control portion, a capacitor, a first ground pattern, a fixing member and a connector. The resin board is fixed to the plate member made of metal. The semi-conductor module is mounted on a first surface of the resin board, which is formed on a side opposite to the plate member. The control portion controls switching operation of the semi-conductor module. The capacitor is mounted on the first surface for smoothing electric current flowing through the semi-conductor module. The first ground pattern is provided on the first surface of the resin board for electrically connecting a ground terminal of the semi-conductor module with a ground terminal of the capacitor. The fixing member is made of metal, extends through the first ground pattern and the resin board, and is fixed to the plate member, in order not only to fix the resin board to the plate member but also to electrically connect the first ground pattern to the plate member. The connector is provided on the first surface of the resin board at such an area opposing to the semi-conductor module so that the first ground pattern is interposed between the semi-conductor module and the connector. A wire harness is connected to the connector for supplying electric current to the semi-conductor module.

According to the above structure, heat from the semi-conductor module and the capacitor is transmitted to the plate member via the first ground pattern and the fixing member. As a result, the heat from the semi-conductor module and the capacitor can be effectively radiated into the air. As above, the first ground pattern and the fixing member not only supplies electric ground current from the semi-conductor module and the capacitor to the plate member but also transmits the heat from the semi-conductor module and the capacitor to the plate member.

The first ground pattern is arranged between the semi-conductor module and the capacitor, both of which have relatively large heat generating amount. The heat from the semi-conductor module is blocked by the first ground pattern. It is, therefore, possible to suppress transfer of the heat from the semi-conductor module to the connector via the resin board. As a result, it is possible to prevent heat interference between the semi-conductor module and the parts and components, which are mounted on the resin board between the first ground pattern and the connector.

According to another feature of the invention, for example, as defined in the claim 2, a second ground pattern is further provided on a second surface of the resin board, which is formed on an opposite side to the first surface, wherein the second ground pattern is electrically connected to the first ground pattern. It is, thereby, possible to transmit the heat from the first ground pattern to the second ground pattern. As a result, it is possible to further increase the heat radiating performance for radiating the heat from the semi-conductor module and the capacitor.

In addition, when the second ground pattern is connected to (brought into contact with) the plate member or when such a member having high heat conductivity is provided between the second ground pattern and the plate member, it is possible to further increase the heat radiating performance for radiating the heat from the semi-conductor module and the capacitor.

According to a further feature of the invention, for example, as defined in the claim 3, a third ground pattern is further provided in an inside of the resin board and electrically connected to the first ground pattern. It is, thereby, possible to transmit the heat from the first ground pattern to the third ground pattern. Therefore, it is possible to further increase the heat radiating performance for radiating the heat from the semi-conductor module and the capacitor. When multiple third ground patterns may be provided, the heat radiating performance can be further increased.

According to a still further feature of the invention, for example, as defined in the claim 4, the first ground pattern has an extending portion, which is electrically connected to a ground terminal of the connector. According to such a feature, the electric ground current from the semi-conductor module and the capacitor flows to the ground terminal of the connector through the extending portion, too. In addition, the heat from the semi-conductor module and the capacitor is likewise transmitted to the ground terminal of the connector via the extending portion. As above, the heat from the semi-conductor module and the capacitor is actively transmitted to the ground terminal of the connector (that is, to the wire harness), so that the heat radiating performance is further increased.

According to a still further feature of the invention, for example, as defined in the claim 5, the capacitor includes multiple capacitors separated from each other and arranged at predetermined distances (dispersion on the ground). According to such an arrangement, a necessary electrostatic capacity is obtained for the capacitor on one hand, while it is possible to effectively radiate the heat from the capacitor on the other hand.

According to a still further feature of the invention, for example, as defined in the claim 6, the electronic control unit further has a shunt resistor, which is mounted on the first surface of the resin board so as to electrically connect the first ground pattern with a ground terminal of the semi-conductor module. The shunt resistor detects the electric current flowing through the semi-conductor module. As a result, it is possible to precisely control the semi-conductor module based on the electric current detected by the shunt resistor.

Since the electric current, which passed through the semi-conductor module, flows through the shunt resistor, the heat generating amount at the shunt resistor is relatively large. According to the invention, the shunt resistor is provided on the first ground pattern at such an area opposing to the connector so that the first ground pattern is interposed between the shunt resistor and the connector. It is, therefore, possible to suppress the heat transfer from the shunt resistor to the connector via the resin board. It is, thereby, possible to prevent the heat interference with the parts and components mounted on the resin board between the first ground pattern and the connector.

According to a still further feature of the invention, for example, as defined in the claim 7, the electronic control unit further has a shunt resistor, which is mounted on the second surface of the resin board so as to electrically connect the second ground pattern with a ground terminal of the semi-conductor module.

The shunt resistor detects the electric current flowing through the semi-conductor module. As a result, it is possible to precisely control the semi-conductor module based on the electric current detected by the shunt resistor.

As explained above, since the electric current, which passed through the semi-conductor module, flows through the shunt resistor, the heat generating amount at the shunt resistor is relatively large. According to the invention, the shunt resistor is provided on the second ground pattern at such an area opposing to the connector so that the first ground pattern is interposed between the shunt resistor and the connector. It is, therefore, possible to suppress the heat transfer from the shunt resistor to the connector via the resin board. It is, thereby, possible to prevent the heat interference with the parts and components mounted on the resin board between the second ground pattern and the connector.

According to a still further feature of the invention, for example, as defined in the claim 8, a heat radiating sheet of electrical insulation and/or heat radiating grease is provided between the resin board and the plate member. It is, therefore, possible to effectively transmit the heat from the resin board to the plate member.

According to a still further feature of the invention, for example, as defined in the claim 9, the plate member has a projecting portion in an area covering the semi-conductor module and the first ground pattern, wherein the projecting portion is projected toward the second surface of the resin board.

It is, therefore, possible to easily bring the plate member (the projecting portion thereof) into contact with the portion of the second surface, which corresponds to the semi-conductor module and the first ground pattern. Since the heat capacity of the plate member can be increased by the thickness the projecting portion, the heat radiating performance for radiating the heat from the semi-conductor module and the capacitor can be correspondingly increased.

According to a still further feature of the invention, for example, as defined in the claim 10, the projecting portion has a recessed portion on a side opposite to the resin board, wherein the recessed portion is recessed in a direction toward the resin board. According to the above structure, heat radiating performance of the plate member is maintained, while a possible weight increase is suppressed.

BRIEF DESCRIPTION OF THE DRAWINGS

The above and other objects, features and advantages of the present invention will become more apparent from the following detailed description made with reference to the accompanying drawings. In the drawings:

FIGS. 5A to 5B show a plate member of the electronic control unit of the first embodiment, wherein FIG. 5A is a top plane view, FIG. 5B is a backside view and FIG. 5C is a cross sectional view taken along a line VC-VC in FIG. 5B;

DETAILED DESCRIPTION OF THE PREFERRED EMBODIMENTS

Figure 1:
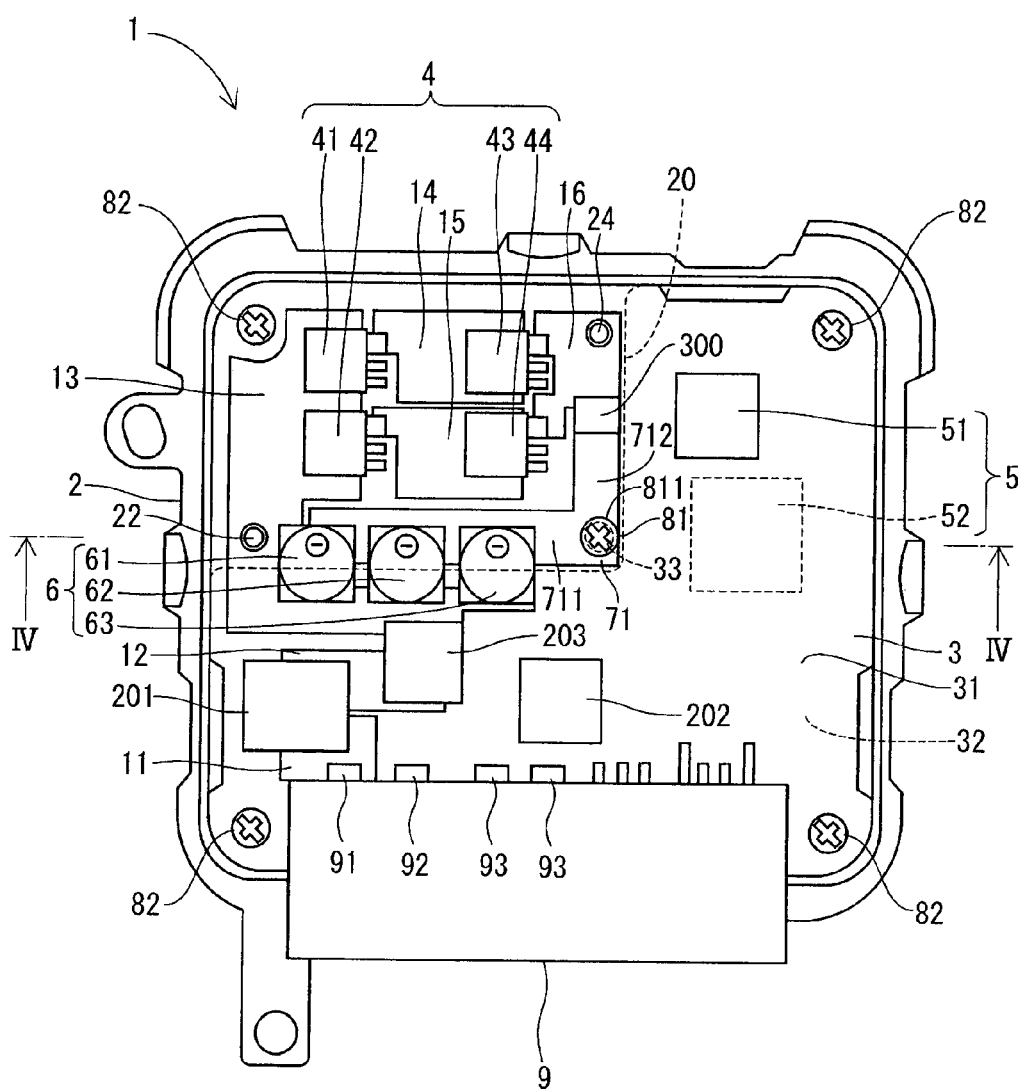
FIG. 1 is a schematic plane view showing an electronic control unit according to a first embodiment of the present invention.

The present invention will be explained by way of multiple embodiments with reference to the drawings. The same reference numerals are given to the same or similar parts and/or portions through the embodiments so as to omit the repeated explanation thereof.

First Embodiment

Figure 2:
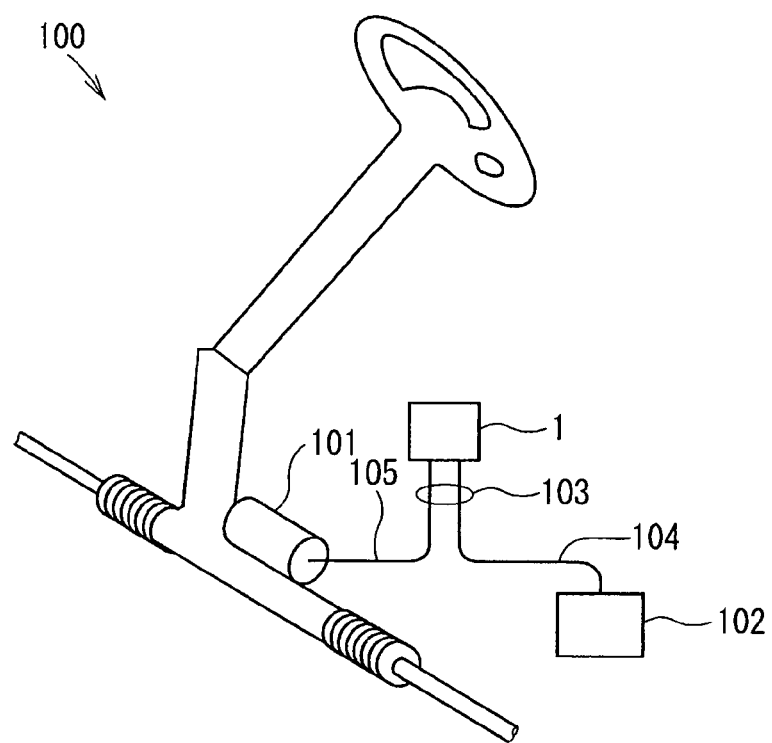
FIG. 2 is a schematic view showing the electronic control unit of the first embodiment of the present invention applied to an electric power steering system.

FIG. 1 shows an electronic control unit 1 (hereinafter also referred to as ECU) according to a first embodiment of the present invention. As shown in FIG. 2, the ECU 1 is applied to an electric power steering system 100 of a vehicle, so that the ECU 1 operates an electric motor 101, which generates an assisting force for a steering operation, based on a steering torque signal, a vehicle speed signal and so on.

As shown in FIG. 1, the ECU 1 has a plate member 2, a printed circuit board 3 made of resin, a semi-conductor module 4, a control portion 5, a capacitor 6, a first ground pattern 71, a fixing member 81, a connector 9 and so on.

The plate member 2 is made of metal, such as aluminum, and formed in an almost rectangular shape.

The printed circuit board 3 is a board made of glass fiber reinforced epoxy resin, such as FR-4. The printed circuit board 3 is formed in an almost rectangular shape similar to the plate member 2 and an outside dimension thereof is smaller than that of the plate member 2. The printed circuit board 3 is arranged on the plate member 2 in such a manner that a surface of the printed circuit board 3 is almost in parallel to that of the plate member 2.

The semi-conductor module 4, which is one of the electronic parts and/or components, is mounted on a first surface 31 of the printed circuit board 3. The first surface 31 is a surface on an opposite side of a surface (a second surface 32) facing to the plate member 2. According to the present embodiment, the semi-conductor module 4 is composed of four modules 41 to 44. Each of the semi-conductor modules 4 (41 to 44) has switching elements (not shown).

According to the present embodiment, the control portion 5 is composed of a micro-computer 51 and a custom IC 52. The micro-computer 51 is mounted on the first surface 31 of the printed circuit board 3, while the custom IC 52 is mounted on the second surface 32 thereof opposite to the first surface 31.

The capacitor 6, which is also one of the electric parts and/or components, is likewise mounted on the first surface 31 of the printed circuit board 3. According to the present embodiment, the capacitor 6 is composed of three capacitors 61 to 63. The three capacitors 61 to 63 are arranged in a straight line at predetermined intervals.

The first ground pattern 71 is a wiring pattern made of a metal thin film (for example, cupper thin film) formed on the printed circuit board 3 (also referred to as the resin board). The first ground pattern 71 is formed on the first surface 31 of the resin board 3 (FIG. 4), so that an upper surface thereof is exposed to the air. The first ground pattern 71 has a long side portion 711 and a short side portion 712, wherein each end of which is connected to each other so as to form a right angle at such a connecting portion. In other words, the first ground pattern 71 is formed in a L-letter shape. Each ground (GND) terminal (a negative side terminal) of the respective capacitors 61 to 63 is connected to the long side portion 711 of the first ground pattern 71.

The fixing member 81 is made of metal, for example, aluminum. According to the present embodiment, the fixing member 81 is a screw. A through-hole 33 is formed at not only the connecting portion of the first ground pattern 71 (at which the long and short side portions 711 and 712 are connected to each other) but also the resin board 3, so that the through-hole 33 extends in a thickness direction of the resin board 3. The fixing member 81 is inserted into the through-hole 33 and screwed into a screw hole formed in the plate member 2 so that the fixing member 81 is fixed to the plate member 2.

An axial tension is generated between the plate member 2 and a top end 811 of the fixing member 81 (at an opposite end to the plate member 2). Therefore, the first ground pattern 71 as well as the resin board 3 is interposed between the top end 811 of the fixing member 81 and the plate member 2, so that they are firmly fixed to the plate member 2. Since the top end 811 of the fixing member 81 is connected to the first ground pattern 71, the first ground pattern 71 and the plate member 2 are electrically connected to each other by the fixing member 81.

According to the present embodiment, each corner of the resin board 3 (four corners) is fixed to the plate member 2 by respective fixing members 82.

The connector 9 is made of resin and formed in a rectangular shape. The connector 9 is arranged on the plate member 2 such that a longitudinal direction of the connector 9 is in parallel to one of side portions of the plate member 2. The connector 9 has a PIG terminal 91 (a power input terminal: a positive side terminal), a ground (GND) terminal 92, motor terminals 93 and so on. As shown in FIG. 2, a wire harness 103 is connected to the connector 9. A wire 104 of the wire harness 103 electrically connects a positive side terminal of a battery 102 to the PIG terminal 91. A wire 105 of the wire harness 103 electrically connects coil ends of the electric motor 101 to the motor terminals 93.

According to the present embodiment, wiring patterns (a first to a six PIG patterns 11, 12, 13, 14, 15 and 16) and electronic and/or electric parts and components (such as, relays 201 and 202, a coil 203, a shunt resister 300 and so on) are mounted on the first surface 31 of the resin board 3 in addition to the above wiring pattern (the first ground pattern 71) and the electronic and/or electric parts and components (the semi-conductor module 4 and the capacitor 6).

The wiring patterns (the first to the six PIG patterns 11, 12, 13, 14, 15 and 16) are wiring patterns made of metal thin films (for example, cupper thin film) formed on the printed circuit board 3 (the resin board). The wiring patterns are formed on the first surface 31 of the resin board 3, so that each upper surface thereof is exposed to the air.

The first PIG pattern 11 connects the PIG terminal 91 of the connector 9 to a positive side terminal of the relay 201. The second PIG pattern 12 connects a negative side terminal of the relay 201 to a positive side terminal of the coil 203. The third PIG pattern 13 connects a negative side terminal of the coil 203 to positive side terminals of the capacitors 61-63 and to positive side terminals (source terminals) of the semi-conductor modules 41 and 42. The fourth PIG pattern 14 connects a ground terminal (a drain terminal) of the semi-conductor module 41 to a positive side terminal of the semi-conductor module 43. The fifth PIG pattern 15 connects a ground terminal of the semi-conductor module 42 to a positive side semi-conductor module 44. The sixth PIG pattern 16 connects ground terminals of the semi-conductor modules 43 and 44 a positive side terminal of the shunt resistor 300. A negative side terminal of the shunt resistor 300 is connected to the short side portion 712 of the first ground pattern 71. Namely, the shunt resistor 300 electrically connects the first ground pattern 71 to the ground terminals of the semi-conductor modules 43 and 44.

As shown in FIG. 1, the first ground pattern 71 is provided on the resin board 3 between the semi-conductor modules 41-44 as well as the shunt resistor 300 and the connector 9. The relays 201 and 202 as well as the coil 203 are provided on the resin board 3 between the first ground pattern 71 and the connector 9.

Figure 3:
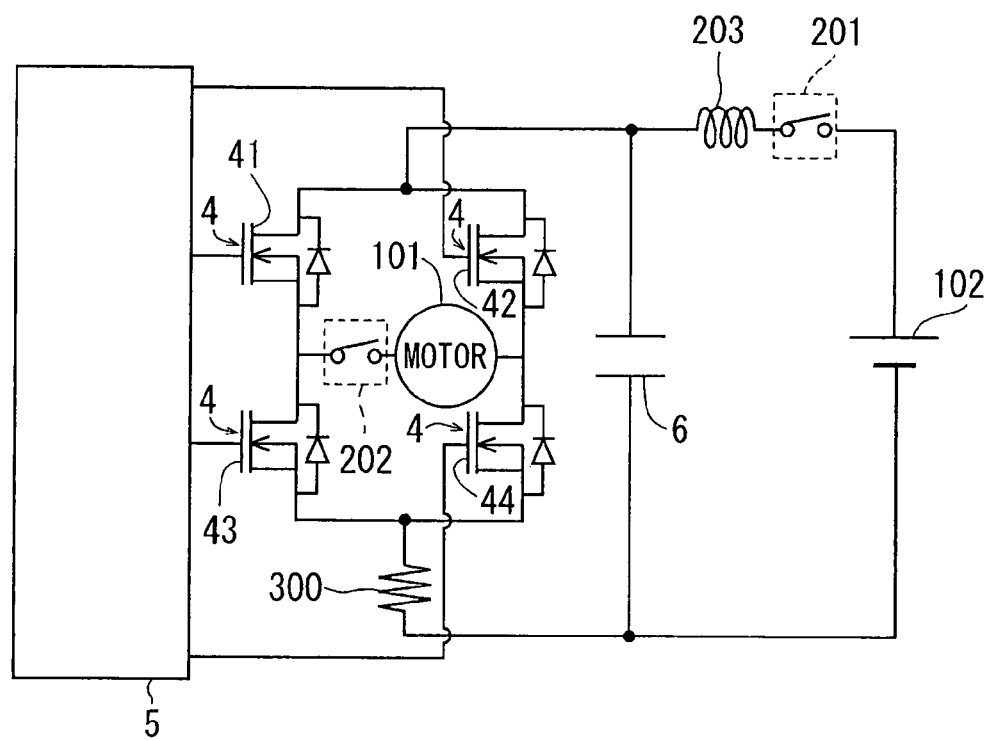
FIG. 3 is a schematic electric circuit of the electronic control unit.

FIG. 3 schematically shows an electric circuit, which is composed of the semi-conductor modules 41 to 44, the capacitor 6, the relays 201 and 202, the coil 203, the shunt resistor 300, the control portion 5 and so on.

The positive side of the battery 102 is connected to the relay 201 via the wire 104 of the wire harness 103, the PIG terminal 91 of the connector 9 and the first PIG pattern 11. The relay 201 allows or prohibits power supply from the battery 102 to the electronic control unit 1.

The electric power of the battery 102 is supplied to the semi-conductor module 4 (the four modules 41 to 44) via the coil 203. The coil 203 is a so-called choke coil to remove noises from the battery 102.

As shown in FIG. 3, the semi-conductor modules 41 and 43 are connected in series, while the semi-conductor modules 42 and 44 are connected in series. In other words, a pair of the semi-conductor modules 41 and 43 is arranged in parallel to another pair of the semi-conductor modules 42 and 44

The relay 202 and the electric motor 101 are arranged between a connecting point of the semi-conductor modules 41 and 43 and another connecting point of the semi-conductor modules 42 and 44. In addition, the shunt resistor 300 is connected to the ground terminal sides of the semi-conductor modules 43 and 44. The capacitor 6 is connected in parallel to the battery 102, namely between a power supply line and a ground line. The capacitor 6 suppresses surge voltage generated by on-off operation of the semi-conductor modules 41 to 44.

According to the above structure, for example, when the semi-conductor modules 41 and 44 are turned on while the semi-conductor modules 42 and 43 are turned off, the electric current flows through the semi-conductor module 41, the relay 202, the electric motor 101 and the semi-conductor module 44. On the other hand, the electric current flows through the semi-conductor module 42, the electric motor 101, the relay 202 and the semi-conductor module 43, when the semi-conductor modules 42 and 43 are turned on while the semi-conductor modules 41 and 44 are turned off. Since the electric motor 101 is a DC type motor, the electric motor 101 is operated to rotate when the semi-conductor modules 41 to 44 are controlled to be turned on and off in the above manner. Each signal line is connected between the respective semi-conductor modules 41 to 44 and the control portion 5 (the custom IC 52), so that the control portion 5 controls the switching operations of the semi-conductor modules 41 to 44, to thereby control the rotational operation of the electric motor 101. The control portion 5 precisely controls the rotational operation of the electric motor 101, based on electric current detected by the shunt resistor 300. Since relatively large electric current flows through the semi-conductor module 4 and the shunt resistor 300 during the switching operation thereof, heat is generated at the semi-conductor module 4 and the shunt resistor 300. The temperature thereof is increased to a relatively high value.

A structure around the first ground pattern 71 will be explained with reference to FIG. 4.

Figure 4:
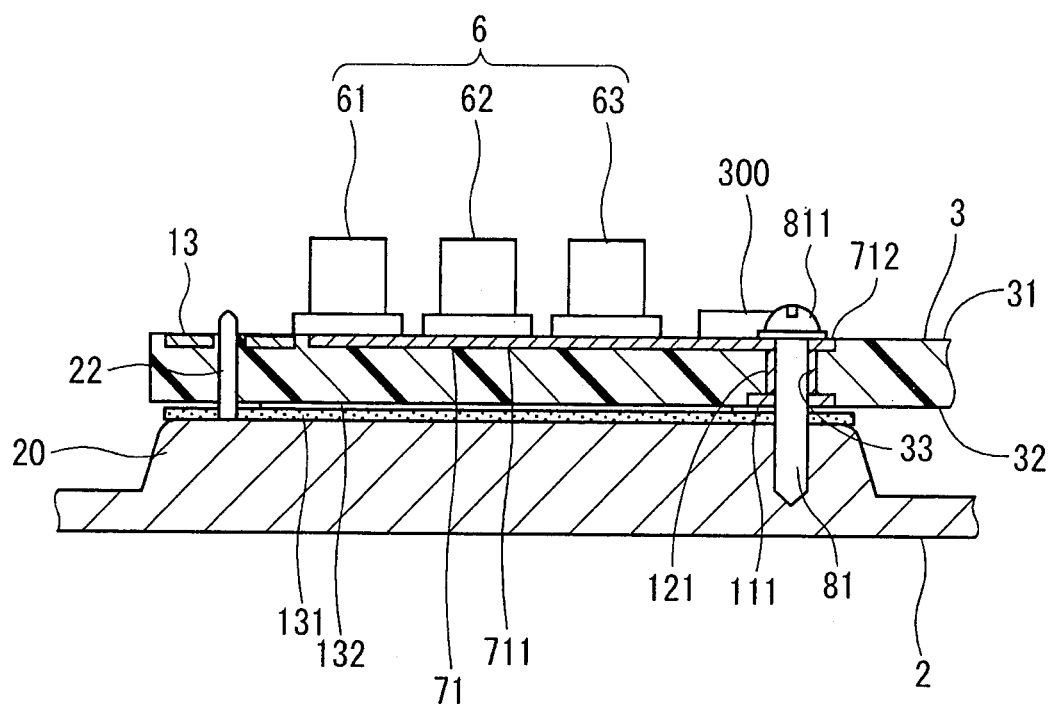
FIG. 4 is a schematic cross sectional view taken along a line IV-IV in FIG. 1.

As shown in FIG. 4, a second ground pattern 111 having a through-hole is provided on the second surface 32 of the resin board 3 at an area adjacent to the fixing member 81. In a similar manner to the first ground pattern 71, the second ground pattern 111 is made of a metal thin film (for example, cupper thin film). The fixing member 81 passes through the through-hole of the second ground pattern 111. The first and second ground patterns 71 and 111 are electrically connected to each other by a connecting member 121. The connecting member 121 is made of metal (for example, cupper) and formed in a cylindrical shape. The fixing member 81 passes through an inside of the connecting member 121. The fixing member 81, the first ground pattern 71, the connecting member 121 and the second ground pattern 111 are mechanically brought into contact with each other. As a result, the electric current (ground current) having passed through the semi-conductor module 4 (the modules 41 to 44) and the capacitor 6 (capacitors 61 to 63) during the switching operation of the semi-conductor module 4 flows to the plate member 2 via the first ground pattern 71, the connecting member 121, the second ground pattern 111 and the fixing member 81. In addition, the heat generated at the semi-conductor module 4 and the capacitor 6 during the above operation (the switching operation of the semi-conductor module) is transmitted to the plate member 2 through the first ground pattern 71, the connecting member 121, the second ground pattern 111 and the fixing member 81. And the heat is finally radiated to the air.

According to the present embodiment, as shown in FIGS. 1, 4 and 5A to 5C, the plate member 2 has a projecting portion 20 in a rectangular area covering the semi-conductor module 4 (the modules 41 to 44) and the first ground pattern 71, wherein the projecting portion 20 is projected toward the second surface 32 of the resin board 3. The projecting portion 20 is formed in a rectangular column shape corresponding to a shape of location (a rectangular shape) for the semi-conductor modules 41 to 44 and the first ground pattern 71.

A heat radiating sheet 131 of electrical insulation and heat radiating grease 132 are provided between the projecting portion 20 and the second surface 32 of the resin board 3. The heat radiating sheet 131 of electrical insulation is made of, for example, an electrically insulating sheet including silicon and having a smaller heat resistance. The heat radiating grease 132 is, for example, gelled grease including silicon as a base material and having a smaller heat resistance.

As a result that a space between the projecting portion 20 and the second surface 32 of the resin board 3 is filled with the heat radiating sheet 131 and the heat radiating grease 132, it is possible to effectively transmit the heat generated in the resin board 3 to the projecting portion 20 of the plate member 2. As above, the projecting portion 20 functions as a heat sink.

Figure 5A:
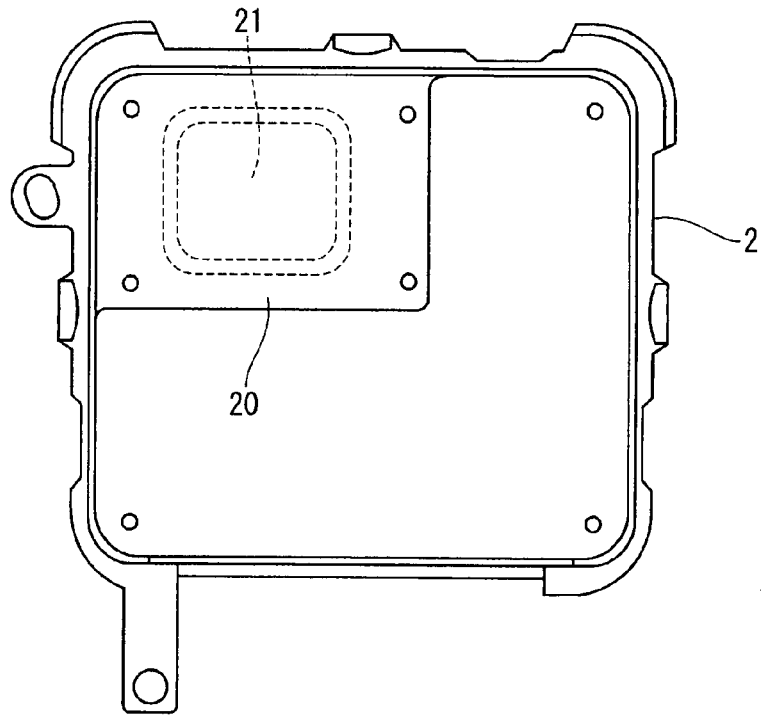
Figure 5B:
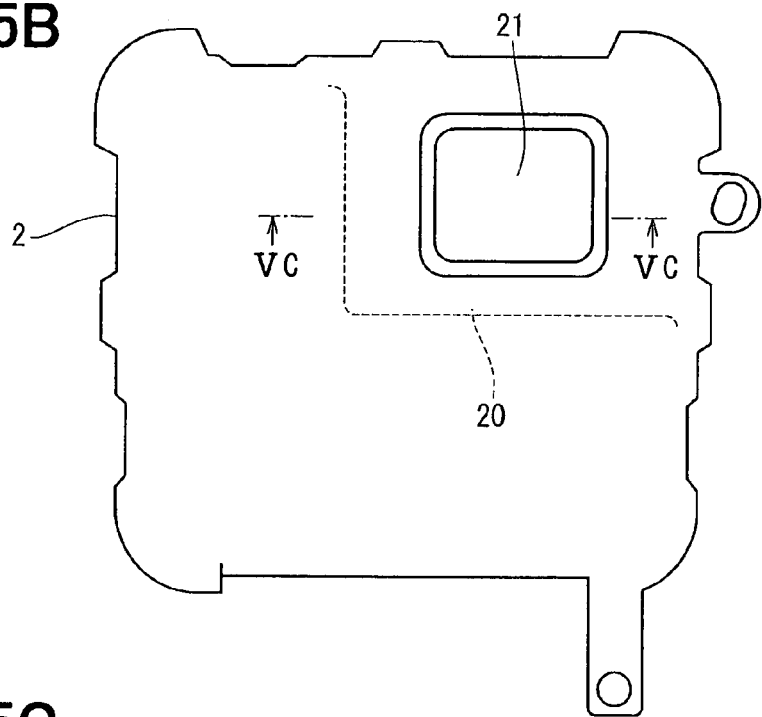
Figure 5C:
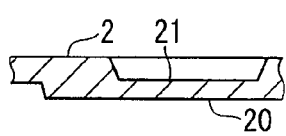

According to the present embodiment, the projecting portion 20 of the plate member 2 has a recessed portion 21 on a side opposite to the resin board 3, wherein the recessed portion 21 is recessed in a direction toward the resin board 3 (as shown in FIGS. 5A to 5C).

In addition, the projecting portion 20 has a positioning pin 22 extending in the direction toward the resin board 3. When the pin 22 is inserted into a hole formed in the resin board 3, the resin board 3 can be precisely positioned with respect to the projecting portion 20.

As explained above, according to the present embodiment, the heat generated at the semi-conductor module 4 and the capacitor 6 is transmitted to the plate member 2 via the first ground pattern 71 and the fixing member 81. As a result, the heat from the semi-conductor module 4 and the capacitor 6 can be effectively radiated into the air. As above, the first ground pattern 71 as well as the fixing member 81 not only transmits the ground current from the semi-conductor module 4 and the capacitor 6 to the plate member 2 but also transmits the heat generated at the semi-conductor module 4 and the capacitor 6 to the plate member 2.

The first ground pattern 71 is arranged between the semi-conductor module 4 (generating relatively large heat) and the connector 9. The heat from the semi-conductor module 4 is thereby blocked by the first ground pattern 71. As a result, it is possible to suppress the heat transfer from the semi-conductor module 4 to the connector 9 via the resin board 3. It is, therefore, possible to prevent heat interference between the semi-conductor module 4 and the electrical parts (the relays 201, 202 and the coil 203) which are also mounted on the resin board 3 between the first ground pattern 71 and the connector 9.

In addition, according to the present embodiment, the second ground pattern 111 is provided between the second surface 32 of the resin board 3 (which is the opposite surface of the first surface 31) and the plate member 2, wherein the second ground pattern 111 is electrically connected to the first ground pattern 71. As a result, it is possible to effectively transmit the heat from the first ground pattern 71 to the second ground pattern 111. It is, therefore, possible to further increase the effective heat radiation of the heat from the semi-conductor module 4 and the capacitor 6.

In addition, according to the present embodiment, the capacitor 6 is divided into multiple capacitors 61 to 63, which are arranged at predetermined intervals. Accordingly, necessary electrostatic capacity for the capacitor 6 is obtained on one hand, and the heat from the capacitors 61 to 63 can be effectively radiated into the air.

Furthermore, according to the present embodiment, the shunt resistor 300 is provided. The shunt resistor 300 is mounted on the first surface 31 of the resin board 3 so that the shunt resistor 300 electrically connects the first ground pattern 71 to the ground terminal side of the semi-conductor module 4. The shunt resistor 300 can detect the electric current flowing through the semi-conductor module 4. It is, therefore, possible to precisely control the semi-conductor module 4 based on the current detected by the shunt resistor 300.

Since the electric current having passed through the semi-conductor module 4 flows through the shunt resistor 300, the heat generated at the shunt resistor 300 is relatively large. According to the present embodiment, the shunt resistor 300 is located at the side of the first ground pattern 71 opposite to the connector 9. As a result, it is possible to suppress the heat transfer from the shunt resistor 300 to the connector 9 via the resin board 3. It is, therefore, possible to prevent heat interference between the shunt resistor 300 and the electrical parts (the relays 201, 202 and the coil 203) which are also mounted on the resin board 3 between the first ground pattern 71 and the connector 9.

According to the present embodiment, the heat radiating sheet 131 of electrical insulation and the heat radiating grease 132 are provided between the resin board 3 and the plate member 2. It is, therefore, possible to effectively transmit the heat from the resin board 3 to the plate member 2.

Furthermore, according to the present embodiment, the plate member 2 has the projecting portion 20 in the area corresponding to the semi-conductor module 4 (the modules 41 to 44) and the first ground pattern 71, wherein the projecting portion 20 project toward the second surface 32 of the resin board 3. It is, therefore, possible to easily place the plate member 2 (the projecting portion 20) at such a position closer to the area of the second surface 32 of the resin board 3 for the semi-conductor module 4 and the first ground pattern 71. In addition, heat mass of the plate member 2 can be increased by a thickness of the projecting portion 20, to thereby increase the heat radiating effect for the heat from the semi-conductor module 4 and the capacitor 6.

In a case that the projecting portion 20 is provided in the plate member 2, weight of the plate member 2 (weight of the ECU 1 itself) may be correspondingly increased. According to the present embodiment, therefore, the recessed portion 21 is formed on the side of the plate member 2, which is the side opposite to the resin board 3, wherein the recessed portion 21 is recessed in the direction toward the resin board 3. As a result, while the high heat radiation of the plate member 2 can be maintained, an increase of the weight of the plate member 2 (the weight of the ECU 1) can be suppressed.

Second Embodiment

Figure 6:
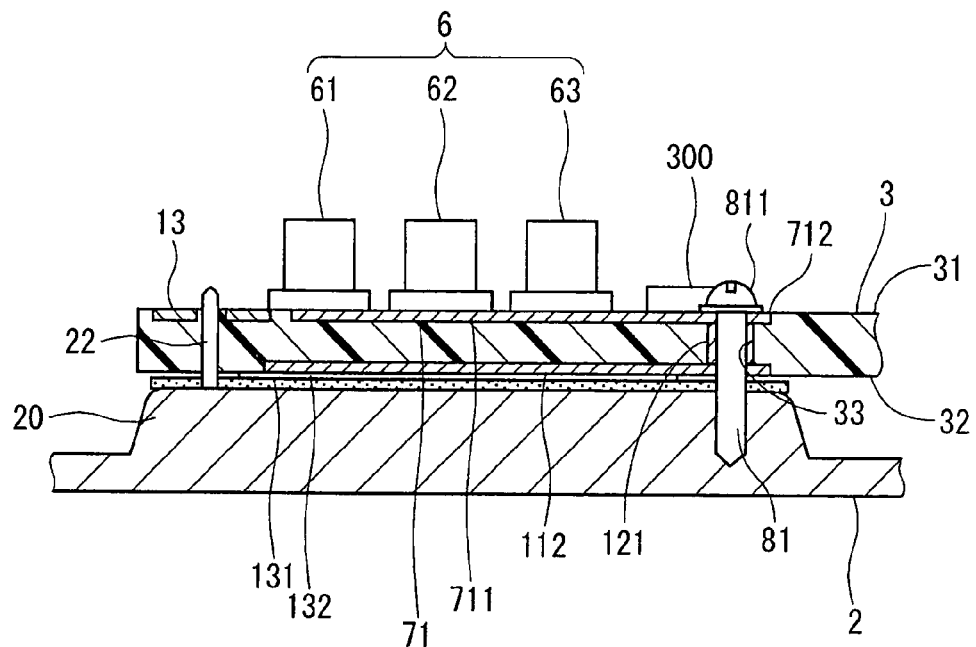
FIG. 6 is a cross sectional view showing a portion around a first ground pattern of an electronic control unit according to a second embodiment of the present invention.

A portion of the electronic control unit according to a second embodiment of the present invention is shown in FIG. 6. In the second embodiment, a shape of the second ground pattern is different from that of the first embodiment.

A second ground pattern 112 of the second embodiment is formed in an L-letter shape in the same manner to the first ground pattern 71 and arranged on the second surface 32 of the resin board 3 at such a position corresponding to the first ground pattern 71. Namely, the second ground pattern 112 is made such that an area thereof is larger than that of the second ground pattern 111 of the first embodiment. According to such a structure, the heat from the semi-conductor module 4 and the capacitor 6 can be more effectively radiated.

Third Embodiment

Figure 7:
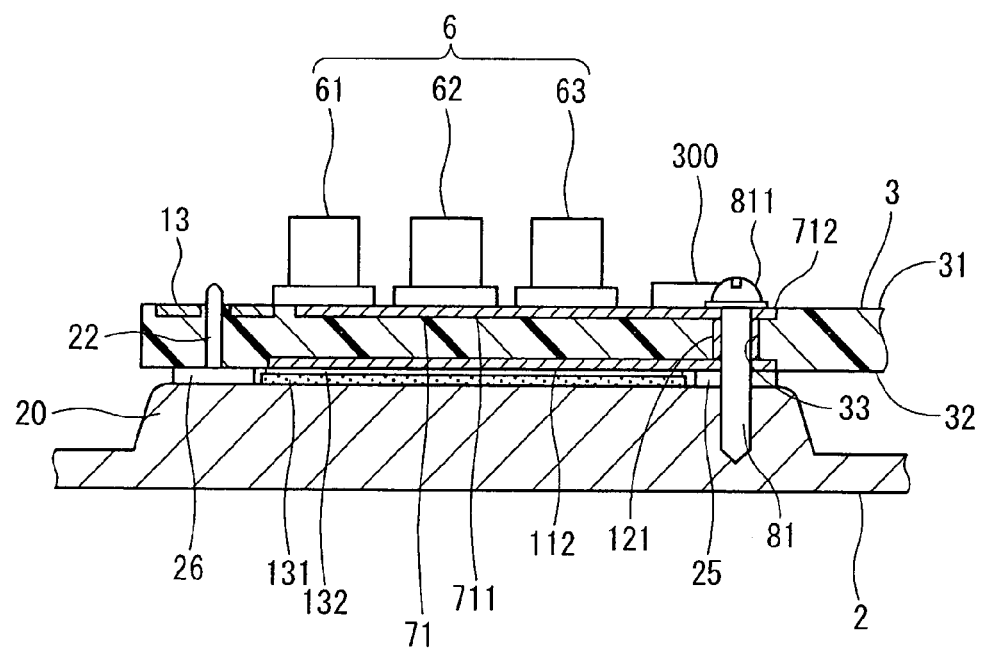
FIG. 7 is a cross sectional view showing a portion around a first ground pattern of an electronic control unit according to a third embodiment of the present invention.

A portion of the electronic control unit according to a third embodiment of the present invention is shown in FIG. 7. In the third embodiment, a structure of the plate member 2 is different from that of the first embodiment.

According to the third embodiment, the projecting portion 20 of the plate member 2 has a seating portion 25 at such a position corresponding to the fixing member 81, wherein the seating portion 25 projects toward the resin board 3. In addition, the projecting portion 20 has another seating portion 26 at a position corresponding to a base of the pin 22, wherein the seating portion 26 projects toward the resin board 3. Namely, the pin 22 is provided at the seating portion 26, wherein the pin 22 projects from the seating portion 26.

When the resin board 3 is fixed to the plate member 2 by the fixing member 81, the second ground pattern 112 is brought into contact with the seating portion 25, while the resin board 3 is brought into contact with the other seating portion 26. Then, a space is formed between the resin board 3 (including the second ground pattern 112) and the projecting portion 20 of the plate member 2, wherein a height of the space is equal to a thickness of the seating portions 25 and 26. The heat radiating sheet 131 of the electrical insulation and the heat radiating grease 132 are provided in the space.

As above, according to the present embodiment, since the second ground pattern 112 is brought into contact with the seating portion 25, the heat from the first ground pattern 71 is effectively transmitted to the seating portion 25 via the connecting member 121 and the second ground pattern 112. When compared with the second embodiment, in which the heat radiating sheet 131 and the heat radiating grease 132 are provided between the second ground pattern 112 and the projecting portion 20 without the seating portion, the heat from the semi-conductor module 4 and the capacitor 6 can be more effectively transmitted to the plate member 2 in the present embodiment and thereby the heat radiating performance can be further increased.

Fourth Embodiment

Figure 8:
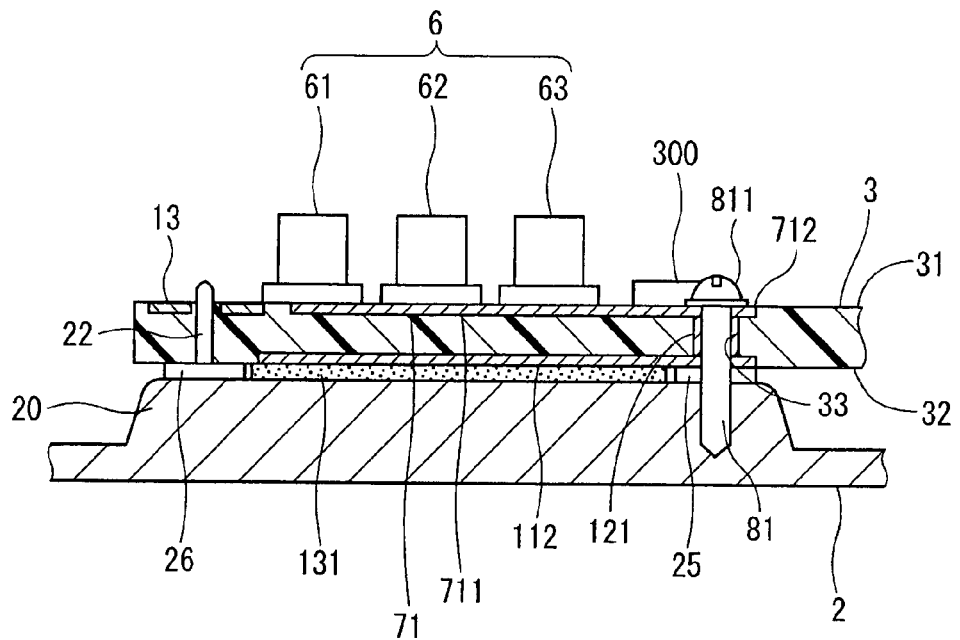
FIG. 8 is a cross sectional view showing a portion around a first ground pattern of an electronic control unit according to a fourth embodiment of the present invention.

A portion of the electronic control unit according to a fourth embodiment of the present invention is shown in FIG. 8.

According to the fourth embodiment, only the heat radiating sheet 131 is provided between the resin board 3 (the second ground pattern 112) and the projecting portion 20 of the plate member 2. A thickness of the heat radiating sheet 131 of the electrical insulating is almost equal to or slightly larger than a height of the space between the resin board 3 and the projecting portion 20. According to such a structure, the heat radiating sheet 131 is tightly adhered to the resin board 3 (the second ground pattern 112) and to the projecting portion 20.

The structure of the fourth embodiment other than the above explained portion is the same to that of the third embodiment.

According to the above fourth embodiment, since only the heat radiating sheet 131 is provided between the resin board 3 (the second ground pattern 112) and the projecting portion 20, the heat from the semi-conductor module 4 and the capacitor 6 can be more effectively radiated into the air, when compared with the third embodiment.

Fifth Embodiment

Figure 9:
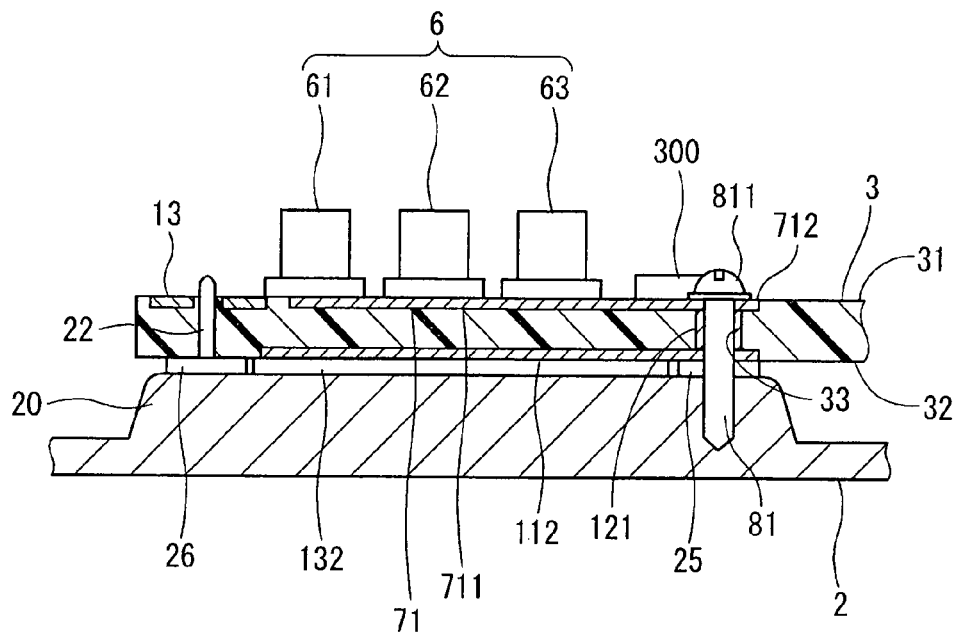
FIG. 9 is a cross sectional view showing a portion around a first ground pattern of an electronic control unit according to a fifth embodiment of the present invention.

A portion of the electronic control unit according to a fifth embodiment of the present invention is shown in FIG. 9.

According to the fifth embodiment, only the heat radiating grease 132 is provided between the resin board 3 (the second ground pattern 112) and the projecting portion 20 of the plate member 2. According to such a structure, the heat from the resin board 3 (the second ground pattern 112) is effectively transmitted to the projecting portion 20 via the heat radiating grease 132.

The structure of the fifth embodiment other than the above explained portion is the same to that of the fourth embodiment.

According to the above fifth embodiment, since only the heat radiating grease 132 is provided between the resin board 3 (the second ground pattern 112) and the projecting portion 20, the heat from the semi-conductor module 4 and the capacitor 6 can be more effectively radiated into the air, when compared with the fourth embodiment.

Sixth Embodiment

Figure 10:
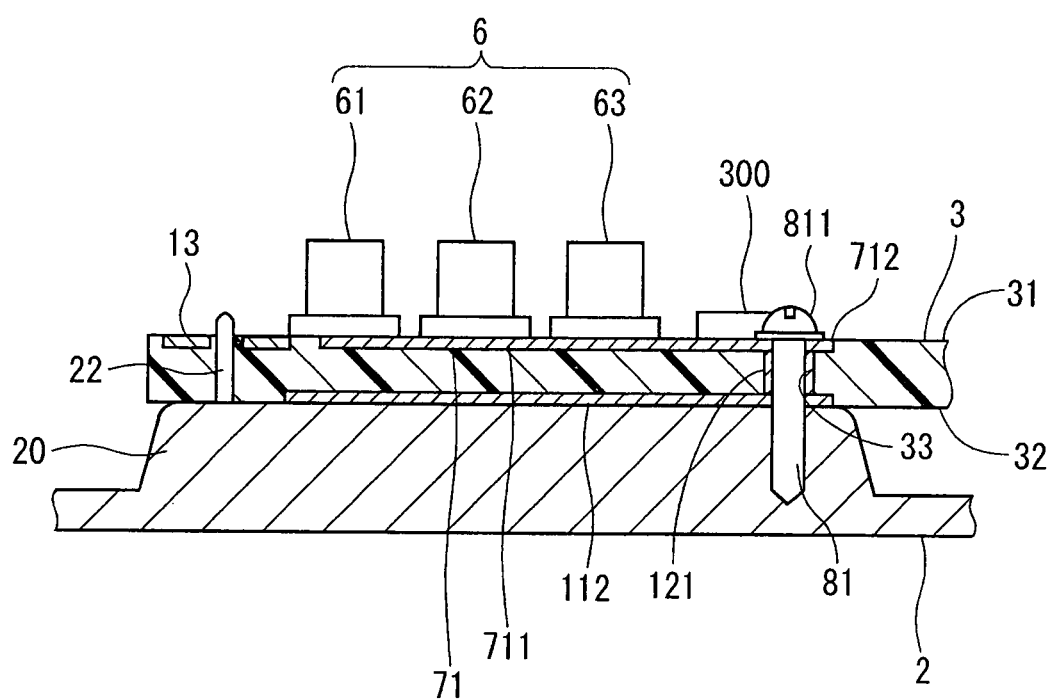
FIG. 10 is a cross sectional view showing a portion around a first ground pattern of an electronic control unit according to a sixth embodiment of the present invention.

A portion of the electronic control unit according to a sixth embodiment of the present invention is shown in FIG. 10.

According to the sixth embodiment, neither the heat radiating sheet 131 nor the heat radiating grease 132 is provided between the resin board 3 (the second ground pattern 112) and the projecting portion 20 of the plate member 2. Namely, the resin board 3 (the second ground pattern 112) is brought into contact with the projecting portion 20 of the plate member 2.

The structure of the sixth embodiment other than the above explained portion is the same to that of the second embodiment.

According to the sixth embodiment, since there is no parts or no members between the resin board 3 (the second ground pattern 112) and the projecting portion 20, surface roughness of the resin board 3 (the second ground pattern 112) as well as surface roughness of the projecting portion 20 is made to be a predetermined smaller value and the axial tension by the fixing member 81 is increased to a predetermined higher value, so that the resin board 3 (the second ground pattern 112) is tightly pressed against the projecting portion 20. Then, compared with the second embodiment, the heat from the semi-conductor module 4 and the capacitor 6 can be more effectively radiated into the air.

Seventh Embodiment

Figure 11:
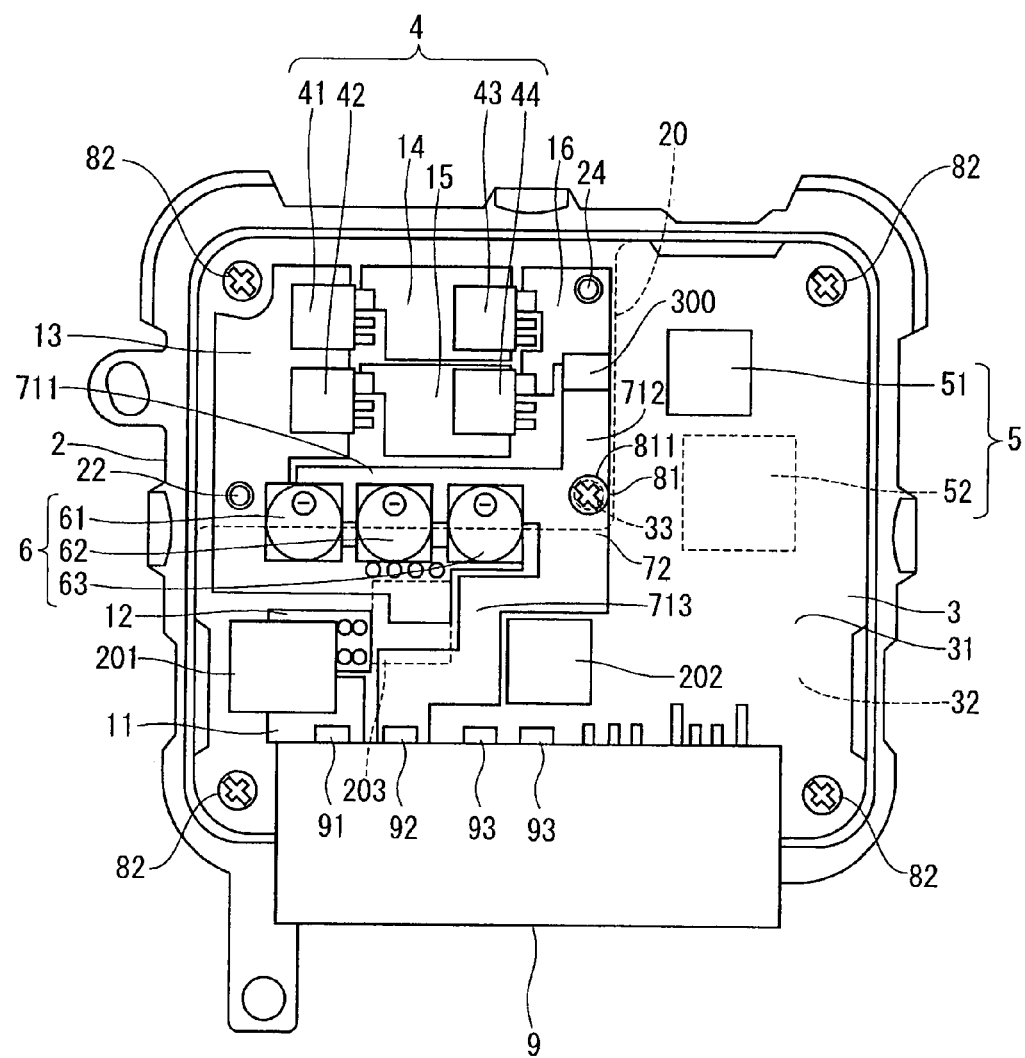
FIG. 11 is a schematic plane view showing an electronic control unit according to a seventh embodiment of the present invention.

An electronic control unit according to a seventh embodiment of the present invention is shown in FIG. 11.

A shape of a first ground pattern of the seventh embodiment is different from that of the first embodiment.

According to the seventh embodiment, the first ground pattern 72 has an extending portion 713, which extends from a connecting portion between the long side portion 711 and the short side portion 712 to the ground terminal 92 of the connector 9. The extending portion 713 is formed in a zigzag shape in order to avoid interference with the relay 202. The extending portion 713 is electrically connected to the ground terminal 92 of the connector 9.

According to the present embodiment, the coil 203 is mounted on the second surface 32 of the resin board 3.

The structure of the seventh embodiment other than the above explained portion is the same to that of the first embodiment.

According to the above seventh embodiment, the first ground pattern 72 has the extending portion 713, which extends to the connector 9 so that it is electrically connected to the ground terminal 92 of the connector 9. As a result, the ground current from the semi-conductor module 4 and the capacitor 6 also flows to the ground terminal 92 of the connector 9 via the extending portion 713. In addition, the heat generated at the semi-conductor module 4 and the capacitor 6 is also transmitted to the ground terminal 92 of the connector 9 via the extending portion 713. As above, the heat generated at the semi-conductor module 4 and the capacitor 6 is actively transmitted to the ground terminal 92 (the wire harness 103) of the connector 9, and thereby the heat radiating performance can be further improved.

Eighth Embodiment

Figure 12:
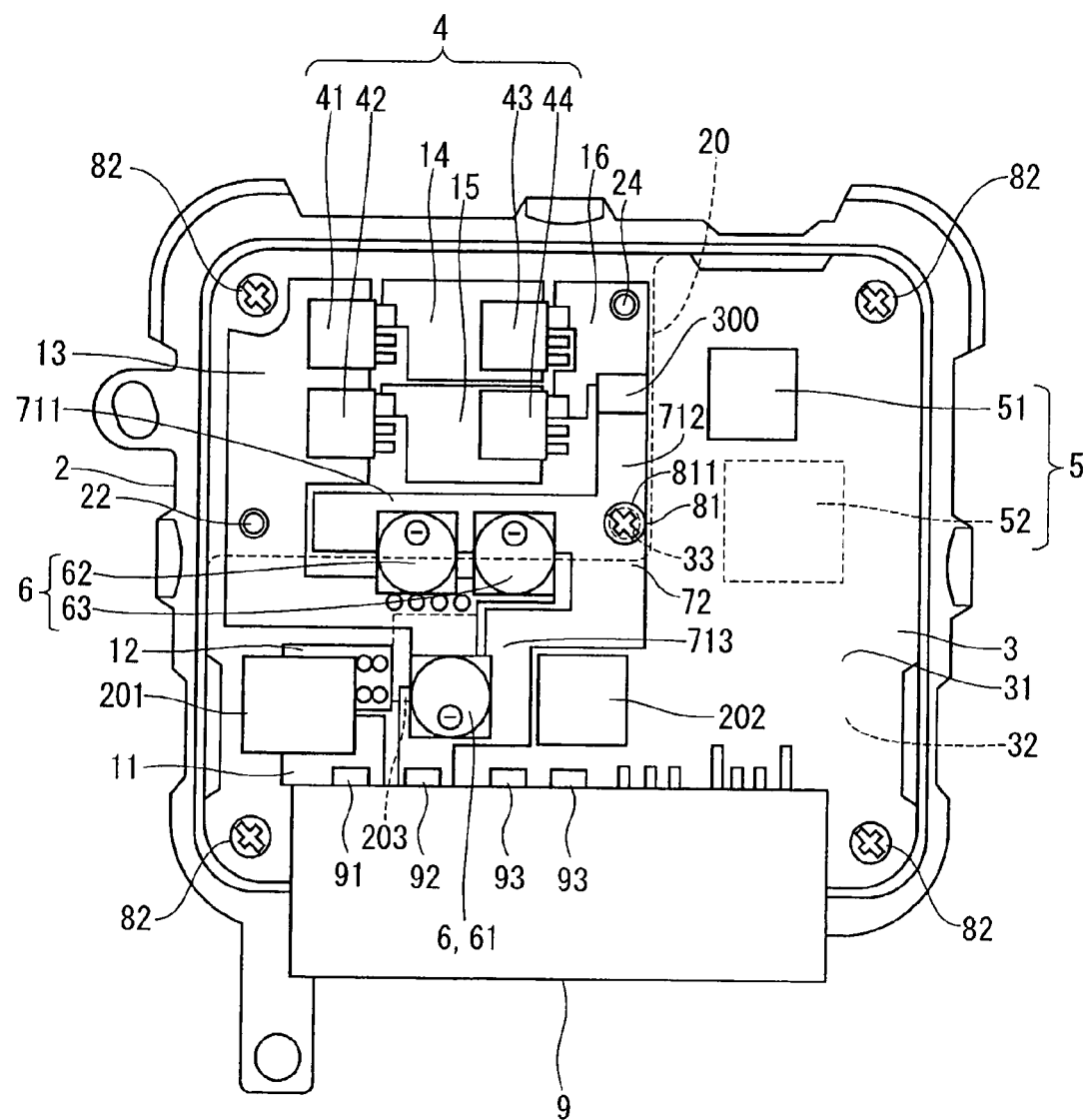
FIG. 12 is a schematic plane view showing an electronic control unit according to an eighth embodiment of the present invention.

An electronic control unit according to an eighth embodiment of the present invention is shown in FIG. 12.

A layout of the capacitor 6 (61 to 63) of the eighth embodiment is different from that of the seventh embodiment.

According to the eighth embodiment, one (61) of the three capacitors 61 to 63 is located at a position adjacent to the ground terminal 92 of the connector 9. A ground terminal of the capacitor 61 is connected to the extending portion 713 of the first ground pattern 72, while a positive side terminal of the capacitor 61 is connected to the third PIG pattern 13.

According to the above structure, the heat from the capacitors 62 and 63 is transmitted to the projecting portion 20 of the plate member 2 via the long side portion 711 of the first ground pattern 72 and the fixing member 81. On the other hand, the heat from the capacitor 61 is transmitted to the wire harness 103 via the extending portion 713 of the first ground pattern 72 and the ground terminal 92 of the connector 9.

As above, according to the present embodiment, one (61) of the three capacitors 61 to 63 is separated from the other two (62 and 63) and located at the position at a predetermined distance therefrom (dispersion on the ground). Therefore, the heat from those capacitors 61 to 63 are transmitted to different portions via the different paths (via the extending portion 713 for the capacitor 61, and the long side portion 711 for the capacitors 62 and 63). The heat radiating performance in the eighth embodiment can be further improved than the seventh embodiment.

Ninth Embodiment

Figure 13:
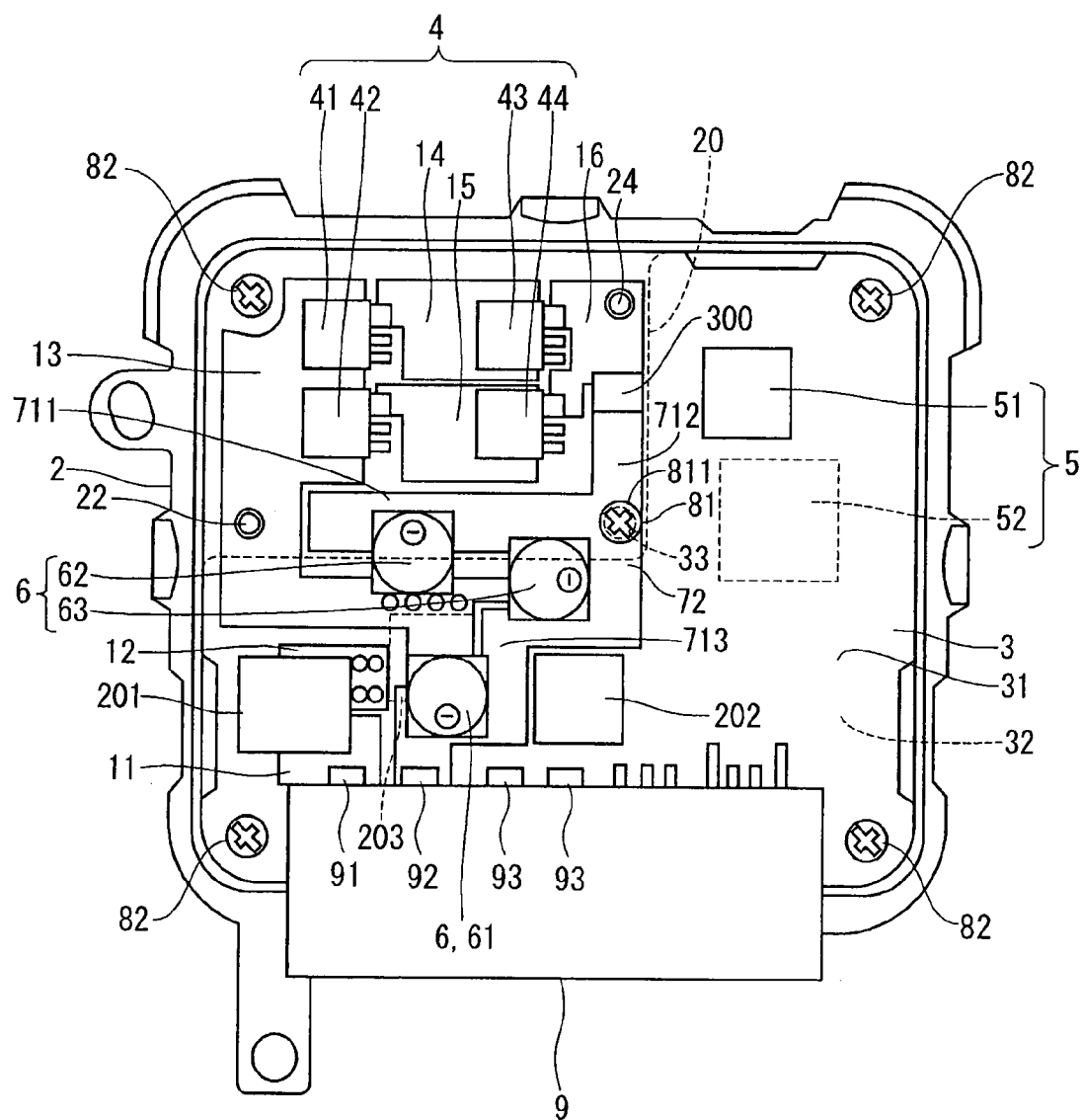
FIG. 13 is a schematic plane view showing an electronic control unit according to a ninth embodiment of the present invention.

An electronic control unit according to a ninth embodiment of the present invention is shown in FIG. 13.

A layout of the capacitor 6 (61 to 63) of the ninth embodiment is different from that of the eighth embodiment.

According to the ninth embodiment, the capacitor 63 is located at a position adjacent to a root portion, at which the long side portion 711 and the extending portion 713 of the first ground pattern 72 are connected to each other. A ground terminal of the capacitor 63 is connected to the root portion, while a positive side terminal of the capacitor 63 is connected to the third PIG pattern 13.

According to the above structure, the heat from the capacitor 63 is transmitted not only to the projecting portion 20 of the plate member 2 via the long side portion 711 and the fixing member 81 but also to the wire harness 103 via the extending portion 713 and the ground terminal 92 of the connector 9.

As above, according to the present embodiment, since the three capacitors 61 to 63 are respectively separated from each other at predetermined distances, the heat from the respective capacitors 61 to 63 can be transmitted and radiated via three different paths (the extending portion 713 for the capacitor 61, the long side portion 711 for the capacitor 62, and the long side portion 711 and the extending portion 713 for the capacitor 63). The heat radiating performance in the ninth embodiment can be further improved than the eighth embodiment.

Tenth Embodiment

Figure 14:
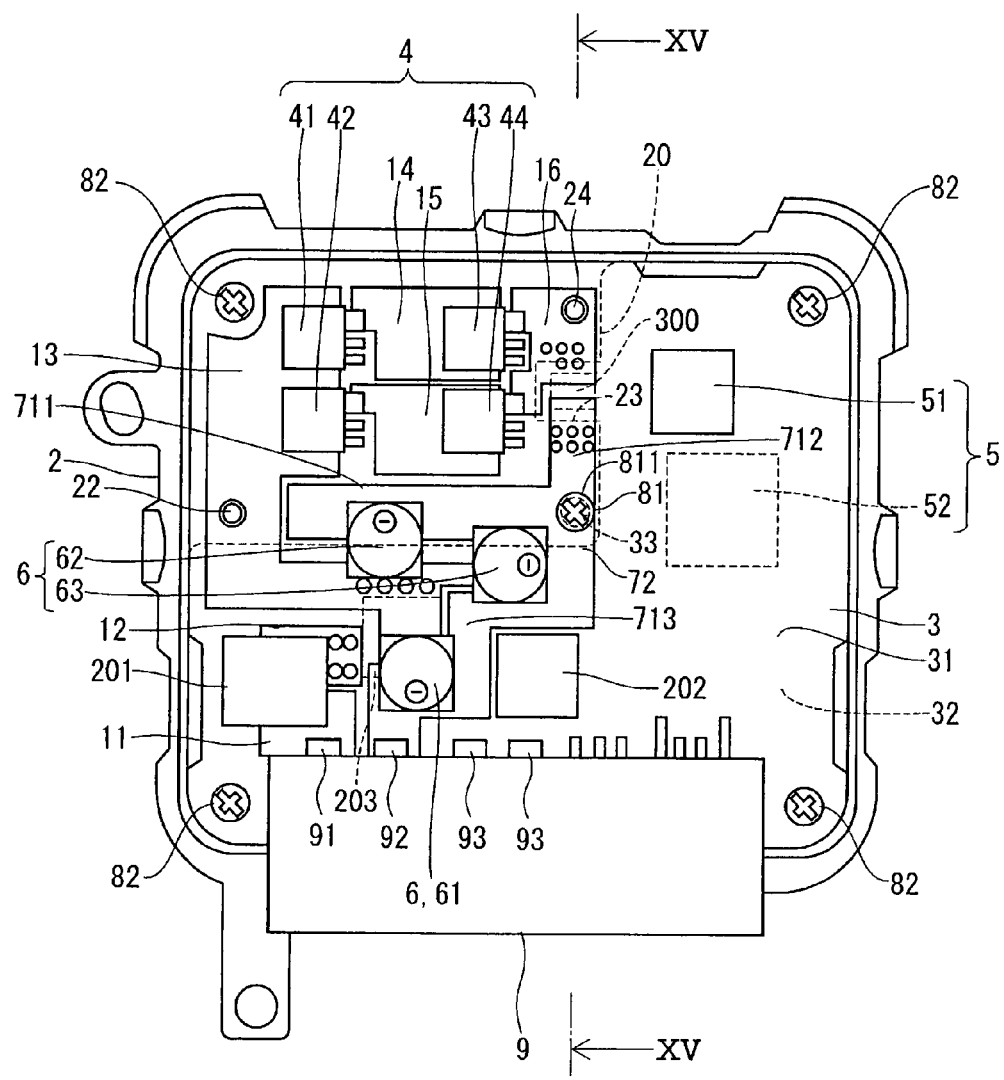
FIG. 14 is a schematic plane view showing an electronic control unit according to a tenth embodiment of the present invention.

An electronic control unit according to a tenth embodiment of the present invention is shown in FIG. 14.

A layout of the shunt resistor 300 of the tenth embodiment is different from that of the ninth embodiment.

Figure 15:
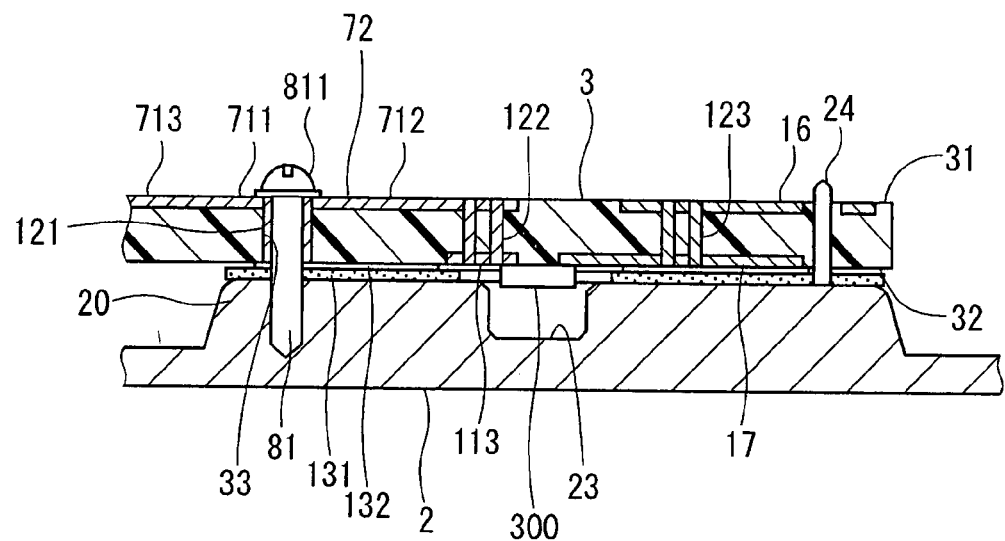
FIG. 15 is a schematic cross sectional view taken along a line XV-XV in FIG. 14.

According to the tenth embodiment, the shunt resistor 300 is mounted on the second surface 32 of the resin board 3, as shown in FIGS. 14 and 15.

As shown in FIG. 15, a second ground pattern 113 is formed on the second surface 32 of the resin board 3. The second ground pattern 113 is electrically connected to the short side portion 712 of the first ground pattern 72 via a connecting member 122. In addition, a seventh PIG pattern 17 is formed on the second surface 32 of the resin board 3. The seventh PIG pattern 17 is electrically connected to the sixth PIG pattern 16 via a connecting member 123. The shunt resistor 300 is provided such that the second ground pattern 113 and the seventh PIG pattern 17 are connected to each other. Namely, the shunt resistor 300 connects the second ground pattern 113 with the ground terminals of the semi-conductor module 4 (43 and 44), so that the shunt resistor 300 detects the electric current flowing through the semi-conductor module 4.

According to the present embodiment, the shunt resistor 300 is provided on the side of the second ground pattern 113, which is opposite to the side of the connector 9. In addition, a recessed portion 23 is formed in the projecting portion 20 of the plate member 2 at a position corresponding to the shunt resistor 300, wherein the recessed portion 23 is recessed in the direction opposite to the resin board 3. According to such a structure, the shunt resistor 300 can be easily mounted on the second surface 32 of the resin board 3. Since the recessed portion 23 is formed, even when the heat is generated at the shunt resistor 300, the heat may not stay around the shunt resistor 300.

In addition, the resin board 3 is positioned by a positioning pin 24 extending from the projecting portion 20 of the plate member 2. Furthermore, the heat radiating sheet 131 of electrical insulation and heat radiating grease 132 are provided between the projecting portion 20 of the plate member 2 and the resin board 3, except for a portion corresponding to the recessed portion 23.

As above, according to the present embodiment, the shunt resistor 300 is mounted on the second surface 32 of the resin board 3, so that the second ground pattern 113 is electrically connected to the ground terminals of the semi-conductor module 4. The shunt resistor 300 detects the electric current flowing through the semi-conductor module 4. Accordingly, it is possible to precisely control the semi-conductor module 4 based on the electric current detected by the shunt resistor 300.

Since the electric current, which passed through the semi-conductor module 4, flows through the shunt resistor 300, heat generated amount at the shunt resistor 300 is relatively large. According to the present embodiment, the shunt resistor 300 is provided on the second ground pattern 113, which is formed on the side opposite to the side of the connector 9. It is, therefore, possible to suppress the heat transfer from the shunt resistor 300 to the connector 9 via the resin board 3. Accordingly, it is possible to prevent heat interference between the parts and/or components (such as the relays 201, 202, the coil 203 and so on), which are mounted on the resin board 3 between the second ground pattern 113 and the connector 9.

According to the present embodiment, the heat from the capacitor 6 is transmitted to the projecting portion 20 of the plate member 2 via the first ground pattern 72, the fixing member 81 and the connecting member 121. The heat from the semi-conductor module 4 is further transmitted to the projecting portion 20 of the plate member 2 via the sixth PIG pattern 16, the connecting member 123 and the seventh PIG pattern 17.

Eleventh Embodiment

Figure 16:
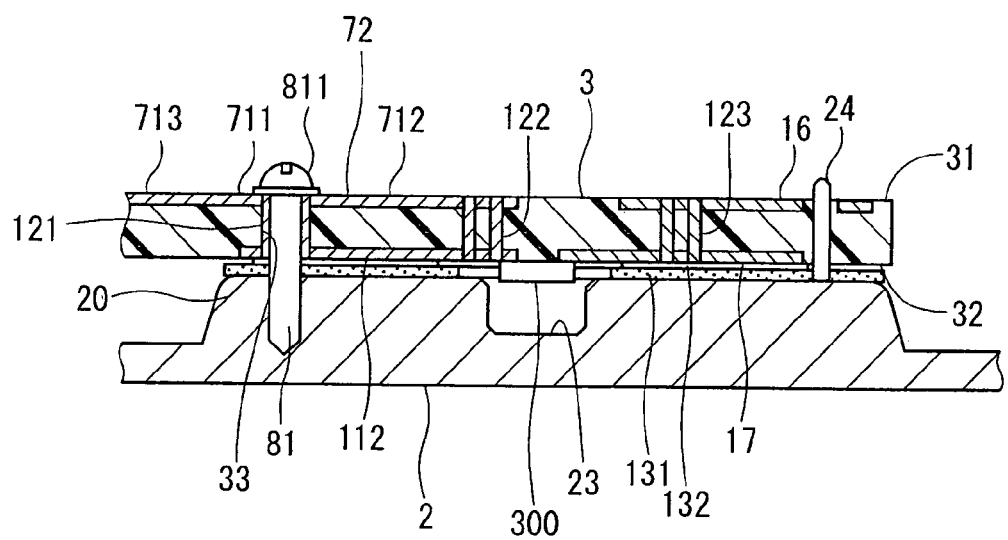
FIG. 16 is a schematic cross sectional view showing a portion around a shunt resister of an electronic control unit according to an eleventh embodiment of the present invention.

An electronic control unit according to an eleventh embodiment of the present invention is shown in FIG. 16. A shape of the second ground pattern of the eleventh embodiment is different from that of the tenth embodiment.

According to the eleventh embodiment, a second ground pattern 112 has a shape corresponding to that of the first ground pattern 72, namely corresponding to the long side portion 711 and the short side portion 712 of the first ground pattern 72. Therefore, the second ground pattern 112 of the eleventh embodiment is similar to the second ground pattern 112 of the second embodiment. According to the present embodiment, the second ground pattern 112 is electrically connected to the first ground pattern 72 via the connecting members 121 and 122.

According to the present embodiment, the second, ground pattern 112 has a larger area than the second ground pattern 113 of the tenth embodiment. As a result, the heat radiating performance of the eleventh embodiment can be further increased than the tenth embodiment.

Twelfth Embodiment

Figure 17:
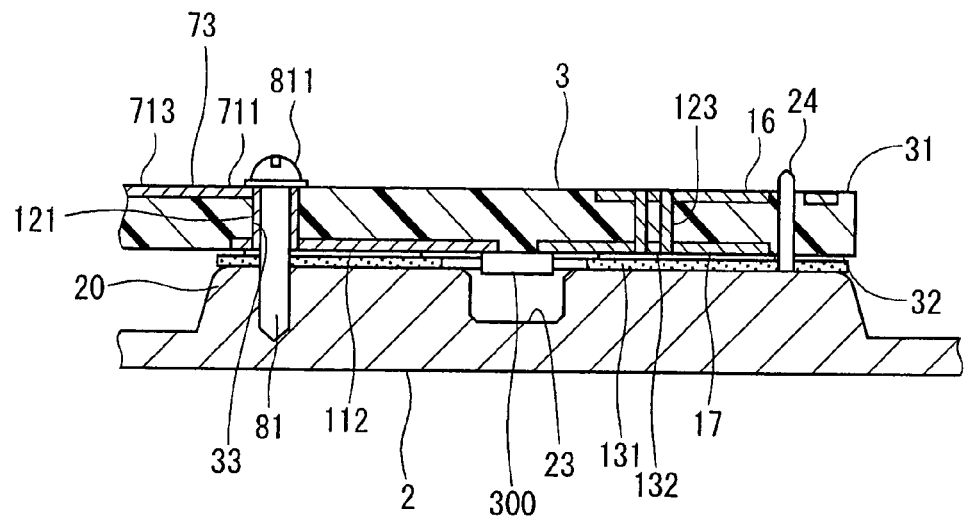
FIG. 17 is a schematic cross sectional view showing a portion around a shunt resister of an electronic control unit according to a twelfth embodiment of the present invention.

An electronic control unit according to a twelfth embodiment of the present invention is shown in FIG. 17. A shape of the first ground pattern of the twelfth embodiment is different from that of the eleventh embodiment.

According to the twelfth embodiment, a shape of the first ground pattern 73 is similar to that of the first ground pattern 72 of the eleventh embodiment, when the short side portion 712 is removed from the first ground pattern 72.

Even according to such a structure, the heat from the capacitor 6 can be effectively transmitted to the projecting portion 20 of the plate member 2 via the first ground pattern 73, the fixing member 81 and the connecting member 121.

Thirteenth Embodiment

Figure 18:
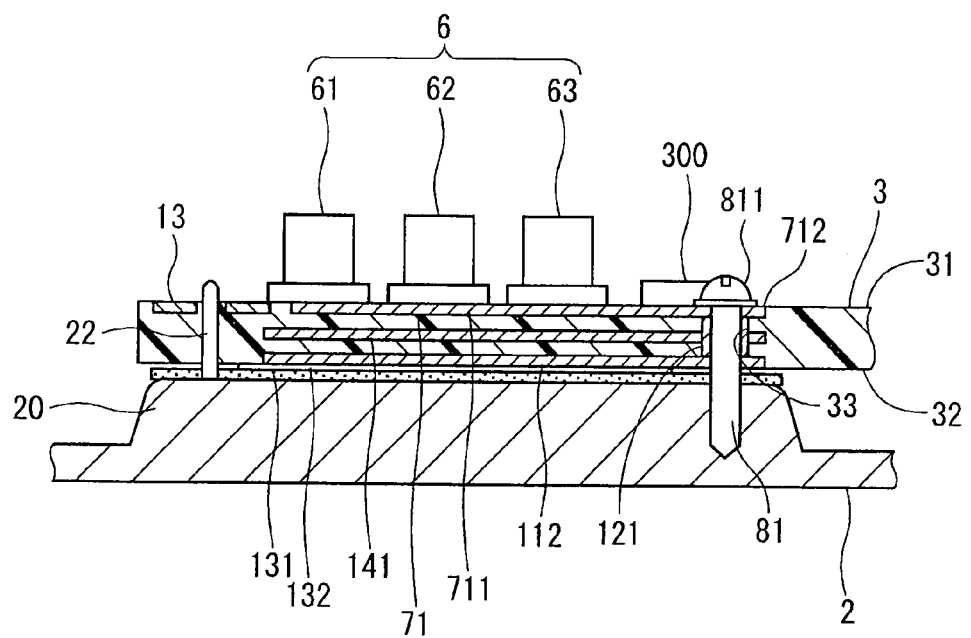
FIG. 18 is a cross sectional view showing a portion of a third ground pattern around an electronic control unit according to a thirteenth embodiment of the present invention.

An electronic control unit according to a thirteenth embodiment of the present invention is shown in FIG. 18. An inside structure of the resin board of the thirteenth embodiment is different from that of the second embodiment (FIG. 6).

According to the thirteenth embodiment, a third ground pattern 141 is provided in the resin board 3. The third ground pattern 141 is made of a metal thin film, such as copper, in the same manner to the first and second ground patterns 71 and 112. The third ground pattern 141 is electrically connected to the first and second ground patterns 71 and 112 via the connecting member 121. The heat from the capacitor 6 (61 to 63) is transmitted to the third ground pattern 141 via the first ground pattern 71 and the connecting member 121. As above, the third ground pattern 141 can be also used for radiating the heat from the capacitor 6 (61 to 63).

Further Embodiments and Modifications

As explained with reference to FIGS. 5A to 5C, the projecting portion 20 of the plate member 2 has the recessed portion 21 on the side opposite to the resin board 3. However, such recessed portion may not be provided. In addition, the projecting portion 20 may not be always provided.

The number of the semi-conductor modules 4 (41 to 44) should not be limited to four (4). The number of the capacitors 6 (61 to 63) should not be limited to three (3).

The other parts and components (such as the relays, the coil, the micro-computer, the custom IC, and so on) than the semi-conductor modules 4 and the capacitors 6 may be mounted on either side of the first and second surfaces 31 and 32.

The fixing member 81 should not be limited to the bolt or screws. For example, a press-inserting member (press-inserted into the plate member 2) may be used.

An upper side of the resin board 3 (opposite to the plate member 2) may be covered by a casing so as to protect the electronic parts and components mounted on the resin board from the outside impact, heat, moisture, liquid and so on.

The above multiple embodiments may be combined to each other unless any disincentive exists.

The electronic control unit may be applied not only to the electric power steering system but also to any other systems for controlling operation of the electric motor.

The present invention should not be limited to the above embodiments, but may be modified in various manners without departing from the spirit thereof.

What is claimed is:

1. An electronic control unit comprising:
   a plate member made of metal;
   a resin board fixed to the plate member;
   a semi-conductor module mounted on a first surface of the resin board, which is formed on a side opposite to the plate member;
   a control portion for controlling switching operation of the semi-conductor module;
   a capacitor mounted on the first surface for smoothing electric current flowing through the semi-conductor module;
   a first ground pattern provided on, the first surface for electrically connecting a ground terminal of the semi-conductor module with a ground terminal of the capacitor;
   a fixing member which is made of metal, extending through the first ground pattern and the resin board, and fixed to the plate member, in order not only to fix the resin board to the plate member but also to electrically connect the first ground pattern to the plate member; and
   a connector provided on the first surface of the resin board at such an area opposing to the semi-conductor module so that the first ground pattern is interposed between the semi-conductor module and the connector, a wire harness being connected to the connector for supplying electric current to the semi-conductor module.

2. The electronic control unit according to the claim 1, further comprising:
   a second ground pattern provided on a second surface of the resin board, which is formed on an opposite side to the first surface, the second ground pattern being electrically connected to the first ground pattern.

3. The electronic control unit according to the claim 1, further comprising:
   a third ground pattern provided in an inside of the resin board and electrically connected to the first ground pattern.

4. The electronic control unit according to the claim 1, wherein
   the first ground pattern has an extending portion electrically connected to a ground terminal of the connector.

5. The electronic control unit according to the claim 1, wherein
   the capacitor includes multiple capacitors separated from each other and arranged at predetermined distances.

6. The electronic control unit according to the claim 1, further comprising:
   a shunt resistor mounted on the first surface so as to electrically connect the first ground pattern with a ground terminal of the semi-conductor module, so that the electric current flowing through the semi-conductor module is detected,
   wherein the shunt resistor is provided on the first ground pattern at such an area opposing to the connector so that the first ground pattern is interposed between the shunt resistor and the connector.

7. The electronic control unit according to the claim 2, further comprising:

a shunt resistor mounted on the second surface so as to electrically connect the second ground pattern with a ground terminal of the semi-conductor module, so that the electric current flowing through the semi-conductor module is detected, wherein the shunt resistor is provided on the second ground pattern at such an area opposing to the connector so that the first ground pattern is interposed between the shunt resistor and the connector.

8. The electronic control unit according to the claim 1, further comprising:

a heat radiating sheet of electrical insulation and/or heat radiating grease provided between the resin board and the plate member.

9. The electronic control unit according to the claim 1, wherein the plate member has a projecting portion in an area covering the semi-conductor module and the first ground pattern, wherein the projecting portion is projected toward the second surface of the resin board.

10. The electronic control unit according to the claim 9, wherein the projecting portion has a recessed portion on a side opposite to the resin board, wherein the recessed portion is recessed in a direction toward the resin board.

* * * * *